United States Patent [19]

Honda

[11] 4,321,515
[45] Mar. 23, 1982

[54] TAPE RECORDER CONTROL SYSTEM

[75] Inventor: Satoru Honda, Tokorozawa, Japan

[73] Assignee: Pioneer Electronic Corporation, Tokyo, Japan

[21] Appl. No.: 77,066

[22] Filed: Sep. 19, 1979

[30] Foreign Application Priority Data

Sep. 22, 1978 [JP] Japan ............................... 53-117118
Sep. 26, 1978 [JP] Japan ............................... 53-118264

[51] Int. Cl.³ .......................................... B65H 59/38
[52] U.S. Cl. ........................................ 318/6; 318/7; 242/75.51
[58] Field of Search .............. 318/6, 7, 386; 242/189, 242/191, 201, 203, 190, 75.51; 360/73

[56] References Cited

U.S. PATENT DOCUMENTS

| | | | |
|---|---|---|---|
| 3,482,229 | 12/1969 | Burr | 360/73 |
| 3,606,201 | 9/1971 | Petusky | 242/190 |
| 3,715,641 | 2/1973 | Mattes | 318/7 |
| 3,914,668 | 10/1975 | Okamoto | 318/7 |
| 4,133,494 | 1/1979 | Nukui | 242/203 |

Primary Examiner—David Smith, Jr.
Attorney, Agent, or Firm—Sughrue, Mion, Zinn, Macpeak and Seas

[57] ABSTRACT

A tape recorder control circuit for operating both right and left-hand drive motors and control solenoids. At the start of a play operation, both motors are operated at a normal speed to nearly instantly take up tape slack after which one motor is operated at normal speed and the other with a low torque to maintain a back tension on the tape. For operating the solenoids, a single circuit configuration is provided which instantly activates the solenoids when switching from the stop mode to the play mode but activates them only after a predetermined time delay when switching from the fast forward or rewind mode to the play mode.

11 Claims, 6 Drawing Figures

TAPE RECORDER CONTROL SYSTEM

BACKGROUND OF THE INVENTION

The invention relates generally to load driving circuits. More specifically, the invention concerns a load driving circuit suitable for driving reel motors and activating devices such as solenoids of a tape recorder device.

In a tape recorder device it is required that a reel motor be driven with a constant current drive to provide a constant speed tape transport when recording or reproducing but be driven with a saturation drive to provide tape transport at a fast speed for the fast forward operation or rewinding.

To comply with such requirement, both a constant current drive circuit and a saturation drive circuit have hitherto been provided for the supply reel motor and take-up reel motor, respectively. Hence, the necessary circuit configuration was inevitably complicated resulting in a requirement for a large number of parts and the necessity for a complex change-over switch circuit.

In an auto-reversing type tape recorder device in which independent motors are provided to drive a right-hand reel and a left-hand reel, respectively, when for instance, forward play operation is selected, the right-hand motor for driving the right-hand reel is driven with a normal torque for constant speed operation while the left-hand motor for driving the left-hand reel is driven with a low torque to provide back tension by acting as reverse electromagnetic brake. In conventional tape recorder devices, such an operation commences at the very instant of start of the play operation. This gives rise to a problem in that, if there is some slack in the tape between both the right-hand and left-hand reels, it takes time to absorb the tape slack by rotation of the right-hand reel. This phenomenon may also occur for play operation in the reverse direction.

Still further, the invention relates to a load driving circuit and specifically to a load driving circuit well-suited to drive various kinds of solenoid operated devices in a tape recorder device.

In tape recorder devices, it is usually required that when the operational mode is switched over from the stop mode to the play (recording or reproducing) mode, both the solenoid for the pinch roller and the solenoid for the braking means for the reel motors are instantly actuated to bring the tape recorder device into the play mode. It is also necessary that when the operational mode is changed over from the fast forwarding or rewinding mode to the play mode, both the solenoids for the pinch roller and the braking means for the reel motors are actuated a predetermined time after the change-over means has been operated. This necessitates two kinds of driving circuits, that is, one is a driving circuit for so-called real time switching in which the load is driven instantly in response to a change-over operation while the other performs so-called delay time switching in which the load is driven only after a predetermined time following the change-over operation. However, independent provision of both two kinds of driving circuit makes the overall driving circuit configuration quite complicated. In such an arrangement, the change-over operation between real time switching and delay time switching is continuous and may be made without a proper braking operation sometimes resulting in tape breakage.

Furthermore, when a pause, namely an instant stop feature is provided, an additional solenoid for the pause operation must consequently be provided, which necessitates the further installation of another set of real time and delay time switching circuits resulting in a much more complicated circuit configuration and complex timing relation among the switching circuits.

It is therefore, a principal object of the invention to provide a load driving circuit to facilitate both constant current drive and saturation drive using only a single circuit configuration.

A further object of this invention resides in the provision of a load driving circuit suitable for operating a reel motor of a tape recorder device which provides for both constant current drive and saturation drive for two loads yet which has a simple circuit configuration.

It is a further object of the invention to provide a tape recorder device in which tape slack is taken up quite quickly prior to starting the play operation.

It is yet a further principal object of the invention to provide a load driving circuit having a simple circuit arrangement for both real time and delay time driving of various solenoids of a tape recorder device.

SUMMARY OF THE INVENTION

In accordance with these objects, one feature of the invention is a load driving circuit for both constant current and saturation drive including an activatable constant current source including an output active element of current drive type, preferably a transistor, an active element, preferably a driving transistor, which is driven by the output current of the output transistor for load driving, activatable biasing means for providing bias current to the control electrode of the output transistor so that the output transistor produces sufficient output current to drive the driving transistor into a saturated or nearly saturated state, and change-over means for selective activation of the constant current source or the bias means.

Furthermore, a load driving circuit for driving a reel motor of tape recorder device in accordance with this invention includes first and second activatable constant current sources each including an output transistor, first and second driving transistors driven by the output currents of the respective output transistors for driving a supply reel motor and a take-up reel motor, respectively, first and second activatable biasing means for providing bias current to the respective control electrodes of the output transistors so that each output transistor produces sufficient output current to drive the respective driving transistor into a saturated or nearly saturated state, and change-over means for selecting among three operational modes, with the first operational mode being such that both the first and second constant current sources are activated, the second operation mode being such that the first biasing means and the second constant current source are activated, and the third operational mode being much that the second biasing means and the first constant current source are activated.

In regard to the aforementioned tape slack problem, the invention provides a solution therefor, wherein, at the starting period of the play operation both in the forward and reverse direction, the motors for driving both the right-hand and left-hand reels are provided with identical rotating torques so as to absorb almost instantly the tape slack between the right-hand and left-hand reels before tape transport during the play operation is started.

Specifically in regard to the objects of the invention concerning the provision of a load driving circuit for solenoids, a particular feature of the invention resides in a circuit arrangement including charging means having a predetermined charge time, a discharging circuit for discharging the charge of the charging means, comparator means for comparing the voltage of said charging means with a predetermined reference voltage so as to produce a control signal when the absolute value of the former exceeds the absolute value of the latter, load driving means for actuating a load in response to the control signal from the comparator means, and a change-over means having at least three operational modes. In the first mode the discharging circuit is activated, in the second mode the reference voltage is applied to the comparator means, and in the third mode the discharging circuit is disconnected and generation of the reference voltage is prevented.

In a preferred embodiment of the invention, these loads may be plunger solenoids for pinch rollers and reel motor braking means of a tape recorder device and the change-over means may be a plurality of switches for various operational modes such as play, fast forwarding, and rewinding.

Other objects, advantages and features of the invention will become apparent upon construction of the following detailed description of the preferred embodiments of the invention taken in conjunction with the accompanying drawings.

DESCRIPTION OF THE PREFERRED EMBODIMENTS OF THE INVENTION

Figure 1:
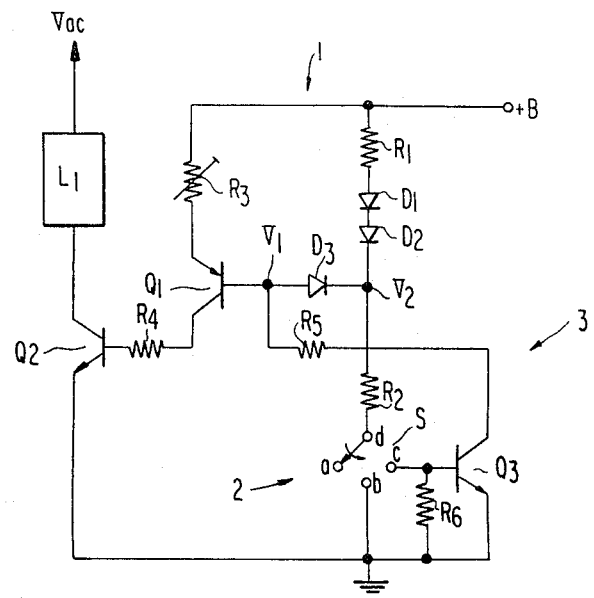
FIG. 1 is a circuit diagram of a first embodiment of the invention.

Referring first to FIG. 1, the invention will be described in its simplest form of driving a single load with reference to a basic circuit. A constant current source circuit 1, which has a circuit configuration well-known to those skilled in the art, includes a PNP transistor $Q_1$ that acts as an output transistor, diodes $D_1$ and $D_2$ and resistors $R_1$, $R_2$ and $R_3$. The constant current source circuit 1 is activated when movable contact d of change-over switch S in change-over circuit 2 is switched to a stationary contact b of the change-over switch S so as to ground one end of the rresistor $R_2$. As a consequence, a constant current output, the value of which is determined by the resistor $R_3$ and other circuit elements, is supplied from the collector of the output transistor $Q_1$ via resistor $R_4$ to driving transistor $Q_2$ which in turn provides a constant current drive for load $L_1$.

A base-bias circuit 3 for the output transistor $Q_1$ is provided so that the driving transistor $Q_2$ can be biased into the saturated or nearly saturated state by the output transistor $Q_1$. The base-bias circuit 3 includes a transistor $Q_3$, a diode $D_3$ and resistors $R_5$ and $R_6$. Circuit 3 is activated when the movable contact d of the change-over switch S is connected to a stationary contact c to render the transistor $Q_3$ conductive.

In this circuit configuration, when the movable contact d of the change-over switch S is connected to the stationary contact a, both the contact current source circuit 1 and the base-bias circuit 3 stay in non-activated states and, consequently, the load $L_1$ is not driven. That is, if the load $L_1$ is an electric motor, it will not rotate.

When the movable contact d of the change-over switch S is switched to the stationary contact b, the transistor $Q_1$ is activated by the current flowing through the series circuit combinations of the resistors $R_1$ and $R_2$ and diodes $D_1$ and $D_2$. Thus, the collector current of the transistor $Q_1$ will be constant and this constant collector current will drive the driving transistor $Q_2$ resulting in the constant drive of the load $L_1$.

Connecting the movable contact d to the stationary contact C renders the transistor $Q_3$ of the base-bias circuit 3 conductive. In this state, although the cathode voltage $V_2$ of the diode $D_3$ is lower than the supply voltage $+B$ by the voltage drop developed by the series circuit of the resistor $R_1$ and diodes $D_1$ and $D_2$, the voltage $V_2$ is nonetheless larger than the anode voltage $V_1$ of the diode $D_3$ because the anode voltage $V_1$ is primarily determined by the dividing ratio of the resistors $R_3$ and $R_5$. Thus, the diode $D_3$ is cut off and the output current of the transistor $Q_1$ is determined only by the condition of the base-bias circuit 3. In this state, since the base voltage of the transistor $Q_1$ is nearly at ground, the transistor $Q_1$ supplies an increased current to the driving transistor $Q_2$ so as to drive the transistor $Q_2$ into the saturated or nearly saturated state. This switching action results in saturation driving of the load $L_1$ in which saturated current is supplied therethrough.

Figure 2:
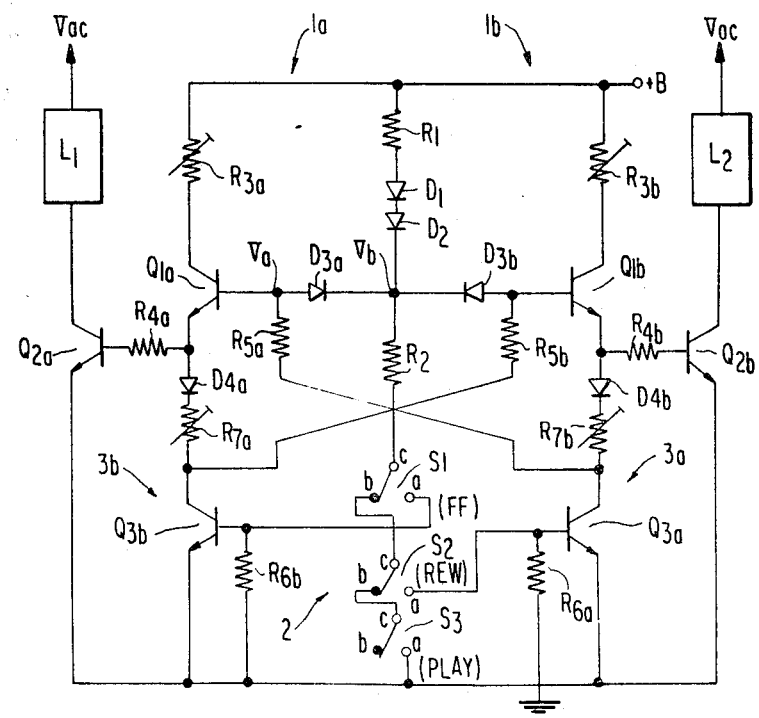
FIG. 2 is a circuit diagram of a second embodiment of the invention.

Referring now to FIG. 2, there is shown another preferred embodiment of this invention in which two loads $L_1$ and $L_2$ are selectively driven with a constant current drive or saturated drive according to demand. In this application of the invention, the driving circuit serves particularly supply reel motor $L_1$ and take-up reel motor $L_2$ of a tape recorder. This circuit configuration includes a pair of circuits arranged symmetrically, each of which has the same structure as the circuit shown in FIG. 1. In this circuit arrangement, two transistors $Q_{2a}$ and $Q_{2b}$ are connected as driving transistors for the supply reel motor $L_1$ and take-up reel motor $L_2$ respectively and two PNP transistors $Q_{1a}$ and $Q_{1b}$ are connected as output transistors for constant current source circuits 1a and 1b respectively. Resistors $R_1$ and $R_2$ and diodes $D_1$ and $D_2$ are used in common both in the constant current source circuit 1a and 1b to simplify the combined circuit arrangement.

Base bias circuits for output transistors $Q_{1a}$ and $Q_{1b}$ are indicated by reference numerals 3a and 3b respectively. Each of these circuits includes respective switching transistors $Q_{3a}$ and $Q_{3b}$.

Change-over circuit 2 includes fast forward (FF) operation switch $S_1$, rewind (REW) operation switch $S_2$ and play (recording or reproducing) switch $S_3$ which are all connected in series between a resistor $R_2$ and ground through stationary contacts b of $S_1$ and $S_2$ and contact a of $S_3$. Stationary contact a of each switch is allocated to the corresponding operating position with the switches constructed, as is well-known, so that when one of the switches is changed over to position a the remaining switches are automatically reset to position b.

Further, a diode $D_{4b}$ and a variable resistor $R_{7b}$ are connected in series between the transistors $Q_{3a}$ and $Q_{1b}$ while a diode $D_{4a}$ and a variable resistor $R_{7a}$ are connected in series between the transistors $Q_{3b}$ and $Q_{1a}$.

In this circuit configuration, assuming that the change-over circuit 2 is in the state illustrated in FIG. 2, since none of the base bias circuits 3a and 3b or the constant current source circuits 1a and 1b are activated, neither of the reel motors $L_1$ and $L_2$ are driven and are in the STOP mode.

When the play switch $S_3$ is changed over to the position a, the resistor $R_2$ is grounded thereby activating the current source and causing the output transistors $Q_{1a}$ and $Q_{1b}$ to turn on with constant current flowing therethrough. As a consequence, both the driving transistors $Q_{2a}$ and $Q_{2b}$ produce a constant current drive with the result that both the reel motors $L_1$ and $L_2$ are driven by the constant current resulting in a constant speed transport of the recording tape. Both the resistors $R_{3a}$ and $R_{3b}$ may be varied to adjust the tape tension.

In order to rewind the tape, the rewind switch $S_2$ is changed over to the position a. In this case, only the transistor $Q_{3a}$ is turned on to activate the bias circuit 3a. Consequently, as described with respect to the operation of the circuit shown in FIG. 1, the diode $D_{3a}$ is cut off causing the transistor $Q_{1a}$ to produce a larger current output to drive the driving transistor $Q_{2a}$ into the saturated or nearly saturated state. This is the so-called switching action. Thus, the reel motor $L_1$ is driven in a saturated mode. On the other hand, since the diode $D_{3b}$ is forward biased, the constant current source circuit 1b is still in the activated state with the output transistor $Q_{1b}$ supplying a constant current output. Hence, the take-up reel motor $L_2$ remains in the constant current driven state. In this state, since the transistor $Q_{3a}$ is turned on, the driving current for the transistor $Q_{2b}$ can accurately be set by adjusting the variable resistor $R_{7b}$ so as to regulate the tape tension.

When the fast forward switch $S_1$ is changed over to the position a for fast forward transport of the tape, contrary to the case of the rewinding mode, the take-up reel motor $L_2$ is driven at saturation while the supply reel motor $L_1$ is actuated in constant current drive, enabling the tape to run at a fast speed. Also in this case, tape tension can be regulated by adjusting the variable resistor $R_{7a}$.

In view of the foregoing description it will readily be recognized that design simplicity of a load driving circuit is achieved with a single circuit configuration according to this invention in which a predetermined load can be driven with a constant current drive or a saturation drive selectively. Further, in the case of two loads, constant current drive and saturation drive are facilitated in a simple circuit configuration without providing independently a constant current drive circuit and a saturation drive circuit for each load.

Figure 3:
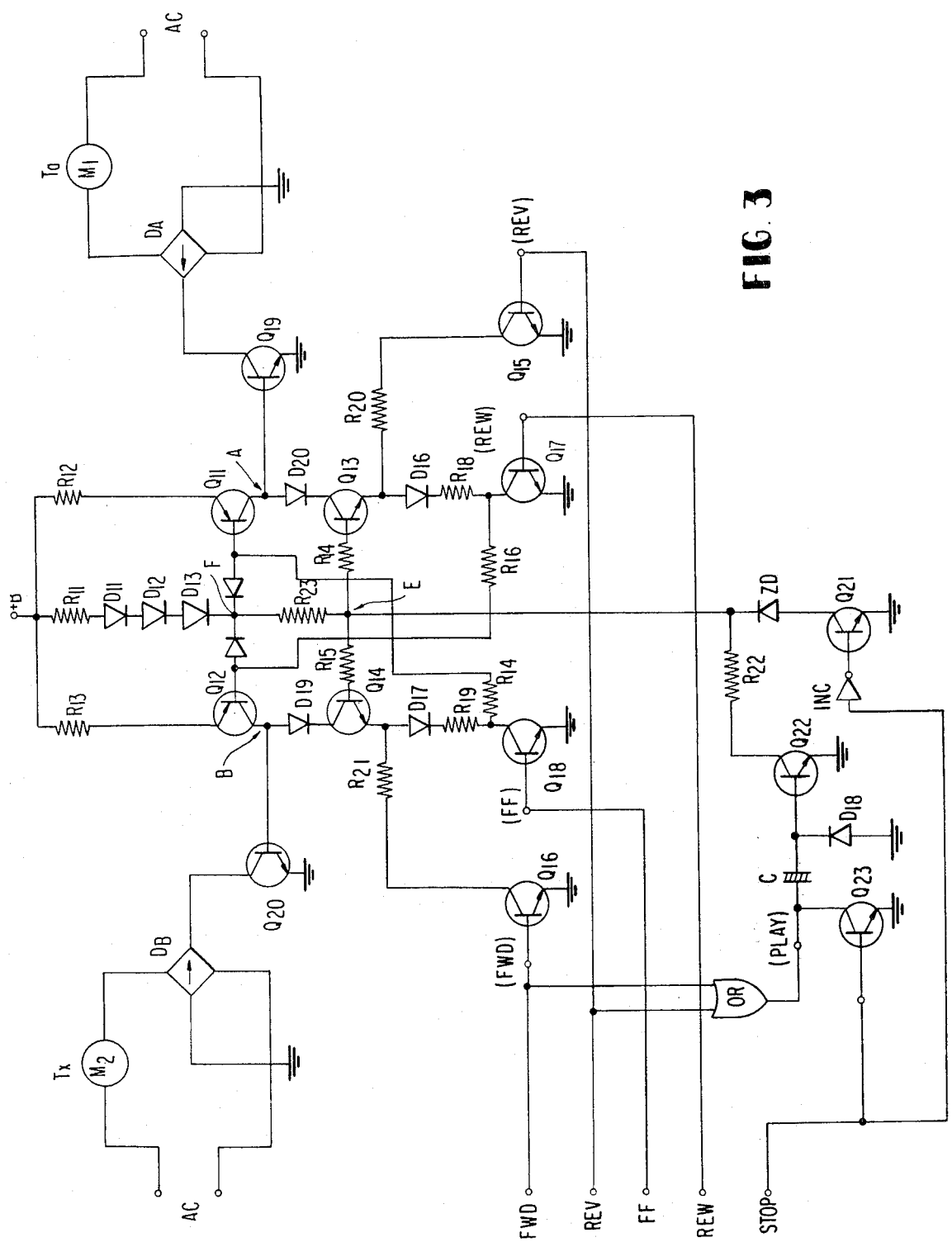
FIG. 3 is a circuit diagram of a reel motor driving circuit of the invention.

FIG. 3 illustrates a driving circuit for reel motors in which both a right-hand motor $M_1$ and a left-hand motor $M_2$ are energized by an A.C. power source AC so that each right-hand and left-hand tape reel can generate torque only in one direction, the direction in which the reel takes up tape. The amount of torque is controlled by the direct current (load current) flowing through full-wave rectifiers $D_A$ and $D_B$ which current is in turn controlled by the conduction state of corresponding transistors $Q_{19}$ and $Q_{20}$. The right-hand motor $M_1$ and the left-hand motor $M_2$ may be driven selectively at a high speed in a fast forwarding or rewinding modes, a medium speed in a recording or reproducing mode and at a low torque for back tensioning depending upon the magnitude, large, medium or small, of the base current flowing in respective transistors $Q_{19}$ and $Q_{20}$.

Both transistors $Q_{11}$ and $Q_{12}$ are biased equally by a potential at the common connection point of diodes $D_{13}$, $D_{14}$ and $D_{15}$ and a resistor $R_{23}$ so as to act as constant current sources while transistors $Q_{13}$ and $Q_{14}$ are also biased evenly by a potenital at the common connection point of resistors $R_{14}$, $R_{15}$ and $R_{23}$ and a zener diode ZD so as to act as constant current sources.

Transistor $Q_{15}$ is provided to reduce when it is conducting the base current of the transistor $Q_{19}$ by absorbing via the transistor $Q_{13}$ some fraction of the current at the point A while transistor $Q_{16}$ when it is conducting reduces the base current of the transistor $Q_{20}$ by absorbing via the transistor $Q_{14}$ some portion of the current at the point B. Transistors $Q_{13}$ and $Q_{14}$ are selectively placed in the conductive state.

Transistor $Q_{17}$ serves, when it is conducting, the dual purpose of causing the transistor $Q_{12}$ to saturate to increase the current flowing at the point B with a consequent increase in the base current of the transistor $Q_{20}$ and of reducing the base current of the transistor $Q_{19}$ by absorbing via the transistor $Q_{13}$ some fraction of the current at the point A. Similarly transistor $Q_{18}$ serves, when it is conducting the dual purpose of biasing the transistor $Q_{11}$ in saturation to increase the current flowing at the point A thus increasing the base current of the transistor $Q_{19}$ and of decreasing the base current of the transistor $Q_{20}$ by absorbing via the transistor $Q_{14}$ some portion of the current at the point B.

The detailed operation of the transistors $Q_{17}$ and $Q_{18}$ will be expanded below.

Transistor $Q_{21}$ biases the transistors $Q_{11}$ to $Q_{14}$ when it is conducting. When both the motors $M_1$ and $M_2$ are required to be de-energized, transistor $Q_{21}$ will be rendered nonconductive.

Transistor $Q_{22}$ is arranged such that it conducts momentarily when a pulse is applied to the base thereof from differentiating capacitor C so as to drop the potential at the point E according to the resistance ratio of the two resistors $R_{22}$ and $R_{23}$ thus causing both the transistors $Q_{13}$ to $Q_{14}$ to turn off with the result that the entire current of the points A and B will flow into the base of respective transistors $Q_{19}$ and $Q_{20}$. In this operation, though the current flowing through the resistor $R_{11}$ will increase to develop a voltage drop thereacross, no significant difference is produced in the potential at the point F because of the small value of the resistor. Transistor $Q_{23}$ and diode $D_{18}$ are provided for discharging the capacitor C.

The operation of the circuit shown in the drawing will now be described. Initially, for play (recording or reproducing) operation in the forward direction, only the terminal FWD is set at a high level potential H while the remaining terminals REV, FF, REW and STOP are set at a low level potential L. The transistor $Q_{21}$ is forward biased and turned on via an inverter INV so as to provide predetermined voltages at the points E and F through the zener diode ZD. At the same time, since the transistor $Q_{22}$ is rendered conductive for a predetermined time by the differentiating operation of the capacitor C, the potential of the point E is reduced below the potential of the zener diode ZD by the voltage dividing action of the resistors $R_{22}$ and $R_{23}$ with the transistors $Q_{13}$ and $Q_{14}$ consequent turned off. Though the potential at the point F is also changed, both the transistors $Q_{11}$ and $Q_{12}$ can act as constant current sources because their base bias remains unaffected. Since the transistors $Q_{13}$ and $Q_{14}$ are off while the collector current of respective transistors $Q_{11}$ and $Q_{12}$ flows into the base of respective transistors $Q_{19}$ and $Q_{20}$, transistors $Q_{19}$ and $Q_{20}$ are biased to the medium extent of saturation. Consequently, the right-hand motor $M_1$ and the left-hand motor $M_2$ are provided with equal amounts of normal torque by the identical normal currents to thereby rotate in the direction of taking up the tape so as to absorb the slack of the tape between the right-hand and left-hand reels.

In the above operation, a modification within the scope of the invention can be made. That is, if the voltage drop across the resistor $R_{22}$ is set slightly above the potential of zener diode ZD so as to turn both the transistors $Q_{13}$ and $Q_{14}$ on slightly, some fraction of the current at the point B may flow through the transistor $Q_{16}$ which renders the transistor $Q_{14}$ on with a consequent reduction in the conductivity of the transistor $Q_{20}$ thereby producing a torque difference between the right-hand and left-hand reel motors $M_1$ and $M_2$. Thus, the speed of absorbing the slack of the tape will be reduced. The actual time needed to absorb the slack is determined by the value of the capacitor C.

Upon the completion of charging the capacitor C, since the transistor $Q_{22}$ is rendered nonconductive, no current flows through the resistor $R_{22}$ and thus the voltage of the zener diode ZD is applied to the point E normally biasing both the transistors $Q_{13}$ and $Q_{14}$ so that their conduction states are similar. However, as stated above, since the transistor $Q_{16}$ is on as a high level H is applied thereto potential, the current flowing at the point B is partially bypassed through the transistors $Q_{14}$ and $Q_{16}$ thus reducing considerably the bias current of the transistor $Q_{20}$ and thereby causing the left-hand motor $M_2$ to produce a very small torque.

When the transistors $Q_{15}$, $Q_{17}$ and $Q_{18}$ are off so that there is no bypass current, all of the current at the point A is used for biasing the transistor $Q_{19}$ keeping it in the medium conduction state and keeping the motor $M_1$ rotating with the medium torque. Consequently, the torque of the left-hand motor $M_2$ is then smaller than that of the right-hand motor $M_1$ with the result that the tape is taken up on the right-hand reel rotated by the right-hand motor $M_1$. In this state, the left-hand motor $M_2$ acts as an electromagnetic brake in the reverse direction so as to provide an appropriate back tension.

In view of the foregoing, it will be recognized that in the play operation in the forward direction (FWD), the tape slack is initially absorbed and then the tape is taken up on the right-hand reel while back tension is provided by the left-hand reel so that transport speed of the tape is constant.

For play operation in the reverse direction (REV), the high level potential H is applied to the REV terminal and the remaining terminals RWD, FF, REW and STOP are held in the low level L. The transistor $Q_{22}$ is again rendered conductive during a first predetermined time. In this case, the transistor $Q_{15}$ is turned on to provide a similar torque to both the motors $M_1$ and $M_2$ to absorb the tape slack. Then, the torque of the right-hand motor is reduced to cause the tape to be taken up on the left-hand reel with the back tension provided by the right-hand reel thus facilitating tape transport at a constant speed in the reverse direction.

For the fast forwarding operation (FF), the FF terminal is provided with the high level potential H while the low level potential is applied to the remaining terminals. Also in this case, although the transistor $Q_{21}$ produces the predetermined voltages at the points E and F respectively as it is in the conductive state, the transistor $Q_{11}$ is strongly biased to the maximum extent of saturation by the conduction of the transistor $Q_{18}$ while the transistor $Q_{12}$ conducts at the medium extent of saturation. Since the current at the point A is blocked by the transistors $Q_{15}$ and $Q_{17}$ it flows into the base of the transistor $Q_{19}$ to bias it into the maximum extent of saturation. On the other hand, the current at the point B is partially bypassed through the transistors $Q_{14}$ and $Q_{18}$ and the remaining current is used to bias the transistor $Q_{20}$ to conduct slightly. Thus, the right-hand motor $M_1$ provides the maximum torque while the left-hand motor $M_2$ provides small torque so that the tape is taken up on the right-hand reel at the high speed while an appropriate back tension is applied.

In the rewinding operation, the high level potential H is provided to the REW terminal and the low level potential L to the remaining terminals. Although the transistor $Q_{17}$ is turned on in this case, the operation is similar to the case of fast forwarding FF. The transistor $Q_{20}$ is brought to the maximum saturation state while the transistor $Q_{19}$ is conducts slightly. Thus, the tape is rapidly wound up by the left-hand reel with an appropriate back tension provided by the right-hand reel.

It may be apparent from the foregoing that with this invention complete absorption of the tape slack is achieved by providing both the reels with an identical torque for a predetermined time at the beginning of the play operation both in the forward and reverse direction.

Figure 4:
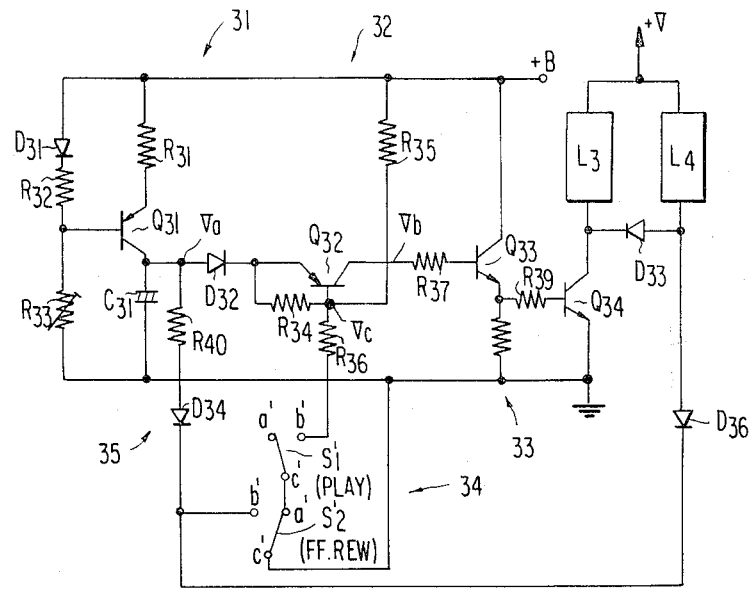
FIG. 4 is a circuit diagram of a solenoid load driving circuit of the invention.

Referring now to FIG. 4 illustrating a diagram of a solenoid driving circuit of the invention. Reference number 31 denotes a charging circuit, and a capacitor $C_{31}$ thereof may be charged by a constant current charging circuit including a PNP transistor $Q_{31}$, diode $D_{31}$ and resistors $R_{31}$, $R_{32}$ and $R_{33}$. The time required to charge the capacitor $C_{31}$ can be varied by the variable resistor $R_{33}$. Reference numeral 32 indicates a comparator circuit for comparing the charging voltage of the charging circuit 31, namely the terminal voltage Va of the capacitor $C_{31}$ with a predetermined reference voltage Vc. Comparator circuit 32 includes grounded base PNP transistor $Q_{32}$, diode $D_{32}$ and a resistor $R_{34}$. Reference numeral 33 denotes a load driving circuit including a pair of NPN transistors $Q_{33}$ and $Q_{34}$ and resistors $R_{37}$, $R_{38}$ and $R_{39}$, which is connected to the collector output Vb of the transistor $Q_{32}$ in the comparator circuit 32 by turning both the transistors $Q_{33}$ and $Q_{34}$ OFF and ON so as to drive two loads, namely a plunger solenoid $L_1$ for the pinch roller and another plunger solenoid $L_2$ for the braking means.

Further, change-over switch circuit 34 is provided including a switch $S'_1$ for activating the PLAY (recording or reproducing) operation and switch $S'_2$ for the FF (fast forward) or REW (rewind) operation. These switches are of the type that when one switch is changed over to a position a', the remaining switches are automatically reset to the position b' as described above. There is provided a discharging circuit 35 including a resistor $R_{40}$ and a diode $D_{34}$ which form a discharge circuit for the capacitor $C_{31}$. In order to provide a reference voltage Vc for the comparator circuit 32, there is provided a voltage divider network including two series-connected resistors $R_{35}$ and $R_{36}$ connected between voltage source $+B$ and the ground. The series connection point between the two resistors $R_{35}$ and $R_{36}$ is coupled to the base of the transistor $Q_{32}$.

The change-over switch circuit 34 is arranged so as to control three operational modes. In the first operational mode, the grounded movable contact c′ of the switch $S'_2$ is changed over to the position b′ to ground the discharging circuit 35 therethrough resulting in activation of the discharging circuit 35. In the second operational mode, the movable contact c of the switch $S'_1$, which is connected to the stationary contact a of the switch $S'_2$ is changed over to the stationary contact b′ to ground the divider network in which is included the series-connected resistors $R_{35}$ and $R_{36}$ with the result that the divider network is activated to supply the divided voltage, that is the reference voltage Vc to the base of the transistor $Q_{32}$. In the third operational mode with the switch contacts in the positions shown in FIG. 4, both the movable contacts of the switches $S'_1$ and $S'_2$ remain on stationary contacts a′, thereby not activating either the discharging circuit 35 or the dividing network.

The load $L_3$ is connected to the load $L_4$ via diode $D_{33}$ and further the load $L_4$ is connected to the stationary contact b′ of the switch $S_{32}$ via diode $D_{35}$.

In operation, assuming firstly that the changeover switch circuit 35 is in the state shown in FIG. 4, that is, in the third operational mode (STOP mode), the terminal voltage Va of the capacitor $C_{31}$ is at nearly the source voltage $+B$ and thus the emitter of the transistor $Q_{32}$ is also at same voltage. On the other hand, since the source voltage $+B$ is also applied to the base of the transistor $Q_{32}$ via the resistor $R_{35}$, the transistor $Q_{32}$ is cut off. As a consequence, both the transistors $Q_{33}$ and $Q_{34}$ are also rendered nonconductive and no current flows through the loads $L_3$ and $L_4$.

Under the circumstances above, when the PLAY switch $S'_1$ is changed over to the position b′, the divided voltage of the divider network, namely the reference voltage Vc is applied to the base of the transistor $Q_{32}$. If the value of the resistor $R_{35}$ is equal to that of the resistor $R_{36}$, the reference voltage Vc will be half the source voltage $+B$ which thus forward biases the transistor $Q_{32}$ to turn it on. Consequently both the transistors $Q_{33}$ and $Q_{34}$ are in turn rendered conductive to actuate both the solenoids $L_3$ and $L_4$ simultaneously, that is to say, real-time drive, which brings the tape recorder device into the PLAY mode. It will also be readily recognized that if the switch $S'_1$ is changed back to the position a′, both the transistors $Q_{33}$ and $Q_{34}$ are instantly turned off and thus both the loads solenoids $L_3$ and $L_4$ are deenergized to bring the tape recorder device back to the STOP mode so that a full cycle of real-time switching has been accomplished.

In order to change the operation into the FF (or REW) mode from the STOP mode, the switch $S'_2$ is changed over to the position b′. The solenoid $L_3$, which is the plunger solenoid for braking means, is actuated by the current flowing through the diode $D_{35}$ which is grounded via the switch $S'_2$. In this state, since the switch $S'_1$ is, as described previously, reset automatically to the position a, the transistors $Q_{33}$ and $Q_{34}$ are off and hence the solenoid $L_3$ for pinch roller is not actuated. On the other hand, since the discharging circuit 35 is activated due to its being grounded through the switch $S'_2$, the capacitor $C_{31}$ starts to discharge. In this situation, if the switch $S'_1$ is switched into the position b′ to bring the recorder device into the PLAY mode, the switch $S'_2$ will be automatically reset to the position a with a consequent disconnection of the discharging circuit 5 from ground thus applying the reference voltage Vc to the base of the transistor $Q_{32}$.

Figure 5:
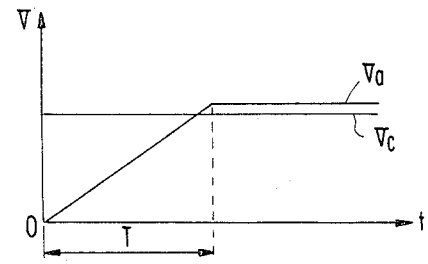
FIG. 5 is a graph relating to the operation of the circuit shown in FIG. 4.

From the graph shown in FIG. 5 which illustrates the relation between the reference voltage Vc and the terminal voltage of the capacitor $C_{31}$, it is apparent that when the terminal voltage of the capacitor $C_{31}$ exceeds the reference voltage Vc, the transistor $Q_{32}$ is turned on and then the transistors $Q_{33}$ and $Q_{34}$ are in turn rendered conductive by the control voltage Vb developed at the collector of the transistor $Q_{32}$ resulting in activation of both the solenoids $L_3$ and $L_4$. This means that both the solenoids for the pinch roller and for the braking means are actuated a predetermined time after the operation of the switch $S'_1$ to thus delay in time the change-over operation from the FF mode to the PLAY mode.

Figure 6:
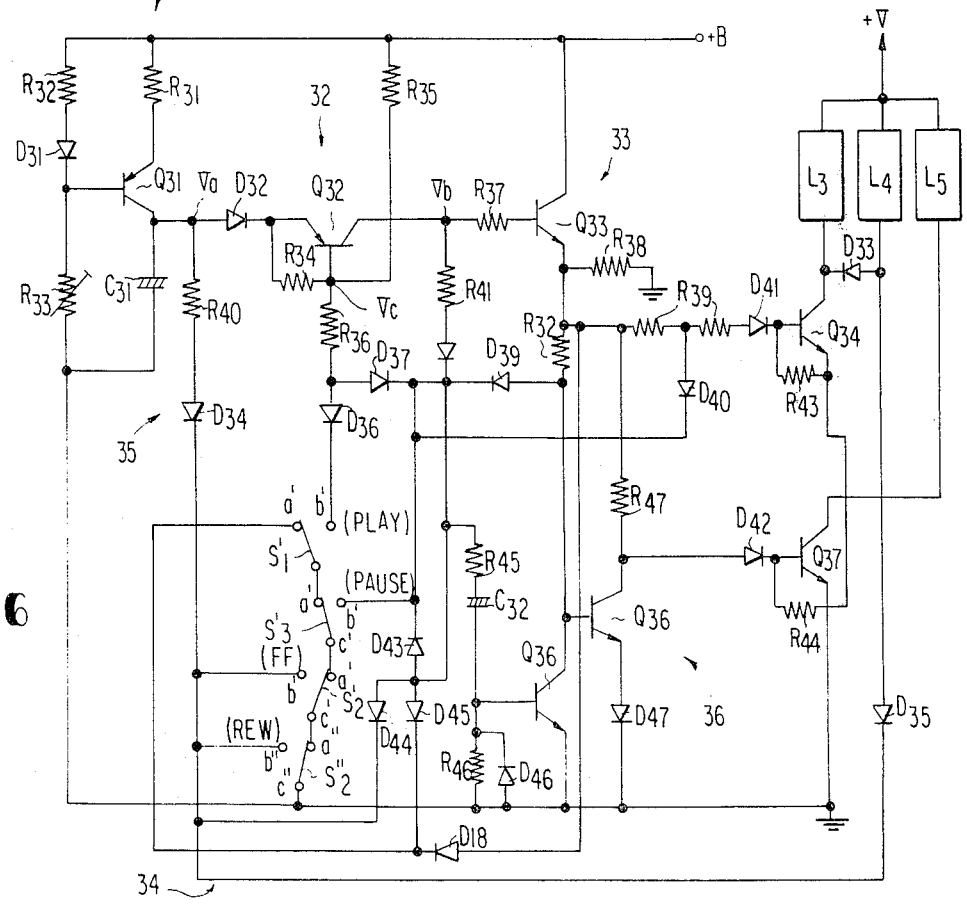
FIG. 6 is a circuit diagram illustrating another embodiment of a solenoid load driving circuit of the invention.

Referring next to FIG. 6, there is therein illustrated a circuit diagram of another preferred embodiment of the invention in which like reference numerals or symbols denote corresponding elements or parts of the circuit shown in FIG. 4. The circuit shown in FIG. 6 illustrates an embodiment of a solenoid driving circuit of a tape recorder device which includes an instant stop (PAUSE) operation. Accordingly, change-over switch circuit 34 includes a PAUSE switch $S'_3$ as well as PLAY switch $S'_1$, FF switch $S'_2$, and REW switch $S''_2$. There are additionally provided a solenoid $L_5$ for PAUSE operation and a driving circuit 36 therefor which includes transistor $Q_{35}$, $Q_{36}$ and $Q_{37}$, diodes $D_{42}$, $D_{46}$ and $D_{47}$, capacitor $C_{32}$, resistors $R_{44}$, $R_{45}$, $R_{46}$ and $R_{47}$ and associated circuit elements.

Since the principle of operation of the circuit of FIG. 3 is similar to that of the circuit shown in FIG. 1, its operation will be described mostly only in terms of the most important points.

When PLAY switch $S'_1$ is changed over to the position b′, both the solenoids $L_3$ and $L_4$ for the pinch roller and braking means are actuated simultaneously quite similar to the case of the previously-described embodiment. At this time, since the capacitor $C_{32}$ starts to be charged, charge current flows through the transistors $Q_{31}$ and $Q_{32}$ and diode $D_{38}$, with a voltage consequently developing across the resistor $R_{46}$ which in turn biases the transistor $Q_{35}$. Hence, as soon as the switch $S'_1$ is operated, the transistor $Q_{35}$ is forward biased and turns on which thereby renders the transistor $Q_{36}$ nonconductive and the transistor $Q_{37}$ conductive resulting in actuation of the solenoid $L_5$ for the PAUSE mode. When the capacitor $C_{32}$ has been charged, no current flows through the resistor $R_{46}$ and consequently forward biasing voltage for the transistor $Q_{35}$ is removed thereby turning the transistor $Q_{35}$ off with the result that the solenoid $L_5$ is deenergized. It may be understood from the foregoing that when a changeover operation is made from STOP mode to PLAY mode, real-time actuation of all three solenoids $L_3$, $L_4$ and $L_5$ is brought about after which only the solenoid $L_5$ is deenergized after a certain predetermined time to cause the tape recorder device to come into the PLAY mode.

If the PAUSE switch $S'_3$ is operated, namely, the switch is changed over to the position b during recording or reproducing, that is, the tape recorder device is in the PLAY mode, the anode of the diode $D_{41}$ is grounded via the diode $D_{40}$ to turn the transistor $Q_{34}$ off so that both the solenoids $L_3$ and $L_4$ are deenergized. At the same time, since the transistor $Q_{33}$, which is on, drives the transistor $Q_{37}$ to the on state, the solenoid $L_4$ for the PAUSE mode is actuated to bring the tape recorder device into the PAUSE mode. Needless to say, when the PAUSE switch $S'_3$ is reset, the tape recorder device returns to the PLAY mode.

When change-over is required from the STOP mode to the FF or the REW mode, FF switch $S'_2$ or REW switch $S''_2$ is switched over to the position b'. This causes the diode $D_{35}$ to be grounded energizing the solenoid $L_4$ for actuating the braking means while deactivating the pinch roller solenoid $L_3$ to thus bring the tape recorder device into the FF or REW mode. While fast forward or rewind transport of tape is going on, if the PLAY switch $S'_1$ is operated, as described above in conjunction with FIG. 4, when the terminal voltage of the capacitor $C_{31}$ exceeds the reference voltage Vc, the transistor $Q_{32}$ is turned on and consequently the transistors $Q_{33}$, $Q_{34}$ and $Q_{37}$ are in turn rendered conductive so that delay time actuation of all three solenoids $L_3$, $L_4$ and $L_5$ is actuated. Then after a predetermined time, as described previously, since the transistor $Q_{35}$ is turned off followed by turning-off of the transistors $Q_{36}$ and $Q_{37}$ so as to deenergize the solenoid $L_5$, the tape recorder device is brought into the PLAY mode.

If the PAUSE switch $S_{33}$ is changed over to position b' during forwarding or rewinding of tape, although the transistors $Q_{32}$ and $Q_{33}$ are on, the transistor $Q_{34}$ is turned off due to grounding of the diode $D_{40}$ with consequent deenergization of the solenoids $L_3$ and $L_4$. At the same time, the transistor $Q_{37}$ is rendered conductive by the action of the transistor $Q_{33}$ so as to energize the solenoid $L_5$ for the PAUSE mode. Thus, tape recorder device is brought into the PAUSE mode.

In view of the foregoing description, it will be readily recognized that the load driving circuit of this invention is effective to accomplish both real-time and delay-time switching for load driving with a single circuit configuration, and is furthermore capable of controlling the operation of plural loads. This invention also provides for precise switching as well as for easily controllable setting of the precise delay time (T) without affecting the real-time switching operation.

While particular embodiments of this invention have been described for controlling the motors and solenoids of a tape recorder device, it will be understood, of course, that the invention is not limited to such applications but is adaptable to any load driving circuit in which comparable switching operations are required.

What is claimed is:

1. A load driving circuit comprising:
   an activatable constant current source including an active output element of a current drive type, said active output element having a control electrode and producing an output current in accordance with the level of bias current provided to said control electrode, said constant current source further including a first activatable biasing means coupled to said control electrode through a diode for providing a first bias current to said control electrode;
   an active element driven by the output current of said output active element for load driving;
   a second activatable biasing means coupled to a connection point between said control electrode and said diode, for producing a second bias current for said control electrode of said output active element, said output active element producing an output current sufficiently large to drive said driven active element into a saturated or nearly saturated state in response to said second bias current; and
   change-over means for selectively activating one of said first or second bias means.

2. A tape recorder device having a right-hand motor and a left-hand motor for providing a right-hand reel and a left-hand reel, respectively, with torque in the direction of taking up tape and having a reel motor driving circuit comprising:
   a first transistor and a second transistor so connected as to be biased in common;
   a third transistor and a fourth transistor so connected as to be biased in common, with said first transistor and said third transistor as well as said second transistor and said fourth transistor being connected in series, respectively;
   a fifth transistor for driving said right-hand motor, the base of said fifth transistor being connected to the series connection point between said first and third transistors;
   a sixth transistor for driving said left-hand motor, the base of said sixth transistor being connected to the series connection point between said second and fourth transistors;
   a seventh transistor for controlling reverse play operation connected in series with said third transistor;
   an eighth transistor for controlling forward play operation connected in series with said fourth transistor;
   a differentiation circuit;
   means for reducing biasing for said third and fourth transistors for a predetermined time by applying a play mode indicating signal through said differentiation circuit at the starting period of the play operation for turning both said third and fourth transistors substantially off, for a predetermined period of time rendering said fifth and sixth transistors conductive to thus provide both said right-hand and left hand motors with substantially identical torques; and
   wherein the current of one of said fifth and sixth transistors is reduced following said predetermined period of time in dependence upon the conduction state of said seventh and eighth transistors so that one of said right-hand and left-hand motors provides a normal torque while the other provides a low torque for producing back tension on said tape.

3. A load driving circuit comprising:
   charging means having a predetermined charge time;
   discharging circuit means for discharging the charge of said charging means;
   comparator means for comparing the voltage of said charging means with a predetermined reference voltage for producing a control signal when the absolute value of said voltage of said charging means exceeds the absolute value of said reference voltage;
   load driving means for actuating a load in response to said control signal from said comparator means; and
   change-over means having at least three operational modes, said discharging circuit being activated in the first operational mode, said reference voltage being applied to said comparator means in the second operational mode with said discharging circuit inactivated, and said discharging circuit being disconnected and the generation of said reference voltage being prevented in the third operational mode.

4. A control circuit for a tape recorder device having right-hand and left-hand motors, comprising:
first and second active elements for controlling the current flow to said right-hand and left-hand motors, respectively, said first and second active elements having each at least one control electrode;
a first constant current source having a first constant current output transistor for providing a control current to said first control electrode, said first constant current source including an activatable voltage divider for providing a bias current to the base of said first constant current output transistor through a first diode;
a second constant current source including a second constant current output transistor for providing a control current to said second control electrode, the base of said second constant current output transistor receiving its bias current through a second diode coupled to said activatable voltage divider, said first and second diodes each having first and second terminals and each having a first terminal coupled to said voltage divider and a second terminal coupled to a respective one of said first and second constant current output transistors whereby said first and second diodes isolate the bases of said first and second constant current output transistors from one another; and
a first bias current control means coupled to a connection point between said first diode and the base of said first constant current output transistor and a second bias current control means coupled to a connection point between said second diode and the base of said second constant current output transistor, said first and second bias current control means separately controlling the bias currents provided to said first and second constant current transistors to thereby separately control the torque produced by said right-hand and said left-hand motors.

5. A control circuit as defined in claim 1, wherein said first bias current control means is coupled to said second control electrode, said first bias control means simultaneously increasing the bias current to said first constant current transistor and decreasing the control current to said second control electrode when activated, and wherein said second bias current control means is coupled to said first control electrode whereby said second bias current control means, when activated, simultaneously increases the bias current supplied to the base of said second constant current transistor and decreases the control current provided to said first control electrode.

6. A control circuit as defined in either one of claims 4 or 5, wherein said first and second bias current control means, when activated, drive said first and second constant current transistors, respectively, into a saturated or nearly saturated state, said control circuit further comprising:
change-over means for selecting among three operational modes, the first operational mode being such that said voltage divider is activated while said first and second bias current control means are inactivated, the second operational mode being such that said voltage divider and first bias current control means are activated while said second bias current control means is inactivated, and the third operational mode being such that said voltage divider and second bias current control means are activated while said first bias current control means is inactivated.

7. A control circuit as defined in either of claims 4 or 5 wherein the torque produced by either of said right-hand and left-hand motors is in a tape take-up direction, said circuit further comprising:
means for temporarily increasing the control currents provided to each of said first and second control electrodes for a period of time following activation of a play mode of operation for taking up slack in said tape.

8. A control circuit as defined in claim 7, wherein said tape slack reducing means comprises a tape slack reducing transistor coupled to said voltage divider for increasing the bias current provided to the bases of each of said first and second constant current output transistors.

9. A load driving circuit as defined in claim 3, wherein said load driving means actuates first and second loads in response to said control signal from said comparator means and wherein said load driving means is inactivated in said first operational mode, said load driving circuit further comprising:
means for driving only one of said first and second loads during said first operational mode.

10. A load driving circuit as defined in claim 9, further comprising delay means coupled to said load driving means for temporarily delaying activation of said load driving means upon switching of said change-over means to said second operational mode.

11. A tape recorder device as defined in claim 2, further comprising:
a ninth transistor connected in series with said third transistor and connected to the base of said second transistor whereby conduction of said ninth transistor will decrease the bias supplied to said fifth transistor while simultaneously increasing the bias supplied to said sixth transistor to thereby implement a rewind mode of operation; and
a tenth transistor connected in series with said fourth transistor and connected to the base of said first transistor whereby conduction of said tenth transistor will decrease the bias supplied to said sixth transistor while simultaneously increasing the bias supplied to said fifth transistor to thereby implement a fast forward mode of operation.

* * * * *